US006756184B2

(12) United States Patent  
Peng et al.

(10) Patent No.: US 6,756,184 B2
(45) Date of Patent: Jun. 29, 2004

(54) METHOD OF MAKING TALL FLIP CHIP BUMPS

(75) Inventors: Chiou-Shian Peng, Hsinchu (TW); Euegene Chu, Hsinchu (TW); Alex Fahn, Jubei (TW); Kenneth Lin, Hsinchu (TW); Gilbert Fane, Hsinchu (TW); James Chen, Hsin Chu (TW); Kuo-Wei Lin, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 17 days.

(21) Appl. No.: 09/976,067

(22) Filed: Oct. 12, 2001

(65) Prior Publication Data

US 2003/0073036 A1 Apr. 17, 2003

(51) Int. Cl.$^7$ ............................. G03F 7/00; H01K 21/00
(52) U.S. Cl. ..................... 430/311; 430/313; 430/315; 430/322; 430/324; 438/612; 228/180.21; 228/180.22
(58) Field of Search ................................ 430/313, 315, 430/322–324; 228/120.21, 180.21, 180.22; 438/612

(56) References Cited

U.S. PATENT DOCUMENTS

| | | | | |
|---|---|---|---|---|
| 4,391,034 A | * | 7/1983 | Stuby | 118/504 |
| 5,251,806 A | * | 10/1993 | Agarwala et al. | 228/180.22 |
| 6,179,200 B1 | * | 1/2001 | Kung et al. | 228/254 |
| 6,204,558 B1 | * | 3/2001 | Yanagida | 257/737 |
| 6,426,176 B1 | * | 7/2002 | Danielson et al. | 430/315 |
| 6,426,281 B1 | * | 7/2002 | Lin et al. | 438/612 |
| 6,440,836 B1 | * | 8/2002 | Lu et al. | 438/612 |

OTHER PUBLICATIONS

Ken Gilleo (ed); "Area Array Packaging Handbook", ch.7, 13,1,4,15; McGraw Hill (2002).*
"Innovations in defluxing Engineered chemistries for removing flux residue on back end solder reflowed bumped wafers"; M.Bixenman, Semicon West (2002) pp. 67–72.*

* cited by examiner

Primary Examiner—Mark F Huff
Assistant Examiner—K. Sagar
(74) Attorney, Agent, or Firm—Tung & Associates

(57) ABSTRACT

A method of making electrically conductive bumps of improved height on a semiconductor device. The method includes steps of depositing an under bump metallurgy over a semiconductor device onto a contact pad; depositing and patterning a photoresist layer to provide an opening over the under bump metallurgy; depositing a first electrically conductive material into the opening in the photoresist layer; depositing a second electrically conductive material over the first electrically conductive material; removing the photoresist layer and the excess under bump metallurgy; applying a flux agent to the top surface of the second electrically conductive material; hard baking the semiconductor device to remove any oxide; dipping a portion of the semiconductor device in an electroless plating solution; removing the semiconductor device from the electroless plating solution; and reflowing the electrically conductive materials to provide a bump of improved height on the semiconductor device.

20 Claims, 4 Drawing Sheets

METHOD OF MAKING TALL FLIP CHIP BUMPS

FIELD OF THE INVENTION

This invention relates to a process of forming a bump on a substrate.

BACKGROUND OF THE INVENTION

A flip chip microelectronic assembly includes a direct electrical connection of face down (that is, "flipped") electronic components onto substrates, such as ceramic substrates, circuit boards, or carriers using conductive bump bond pads of the chip. Flip chip technology is quickly replacing older wire bonding technology that uses face up chips with a wire connected to each pad on the chip.

The flip chip components used in flip chip microelectronic assemblies are predominantly semiconductor devices, however, components such as passive filters, detector arrays, and MEM devices are also being used in flip chip form. Flip chips are also known as "direct chip attach" because the chip is directly attached to the substrate, board, or carrier by the conductive bumps.

The use a flip chip packaging has dramatically grown as a result of the flip chips advantages in size, performance, flexibility, reliability, and cost over other packaging methods and from the widening availability of flip chip materials, equipment and services. In some cases, the elimination of old technology packages and bond wires may reduce the substrate or board area needed to secure the device by up to 25 percent, and may require far less height. Further, the weight of the flip chip can be less than 5 percent of the old technology package devices.

Flip chips are advantageous because of their high-speed electrical performance when compared to other assembly methods. Eliminating bond wires reduces the delay in inductance and capacitance of the connection, and substantially shortens the current path resulting in the high speed off-chip interconnection.

Flip chips also provide the greatest input/output connection flexibility. Wire bond connections are generally limited to the perimeter of the chip or die, driving the die sizes up as a number of connections have increased over the years. Flip chip connections can use the whole area of the die, accommodating many more connections on a smaller die. Further, flip chips can be stacked in 3-D geometries over other flip chips or other components.

Flip chips also provided the most rugged mechanical interconnection. Flip chips when underfilled with an adhesive such as an epoxy, can withstand the most rugged durability testing. In addition to providing the most rugged mechanical interconnection, flip chips can be the lowest cost interconnection for high-volume automated production.

The bumps of the flip chip assembly serve several functions. The bumps provided an electrical conductive path from the chip (or die) to the substrate on which the chip is mounted. A thermally conductive path is also provided by the bumps to carry heat from the chip to the substrate. The bumps also provided part of the mechanical mounting of the chip to the substrate. A spacer is provided by the bumps that prevents electrical contact between the chip and the substrate connectors. Finally, the bumps act as a short lead to relieve mechanical strain between the chip and the substrate.

Flip chips are typically made by a process including placing solder bumps on a silicon wafer. The solder bump flip chip processing typically includes four sequential steps: 1) preparing the wafer for solder bumping; 2) forming or placing the solder bumps on the wafer; 3) attaching the solder bumped die to a board, substrate or carrier; and 4) completing the assembly with an adhesive underfill. A brief description of the prior art methods of performing the first step will provide a better background for understanding the present invention.

The first step in a typical solder bumping process involves preparing the semiconductor wafer bumping sites on bond pads of the individual integrated circuits defined in the semiconductor wafer. The preparation may include cleaning, removing insulating oxides, and preparing a pad metallurgy that will protect the integrated circuits while making good mechanical and electrical contact with the solder bump. Accordingly, protective metallurgy layers may be provided over the bond pad. Ball limiting metallurgy (BLM) or under bump metallurgy (UBM) generally consists of successive layers of metal. The "adhesion" layer must adhere well to both the bond pad metal and the surrounding passivation, provide a strong, low-stress mechanical and electrical connection. The "diffusion barrier" layer prevents the diffusion of solder into the underlying material. The "solder wettable" layer provides a wettable surface for the molten solder during the solder bumping process, for good bonding of the solder to the underlying metal.

In fabrication of a flip-chip bond structure, the fabrication process requires a tight control of interface processes and manufacturing parameters in order to meet very small dimensional tolerances. Various techniques may be utilized to fabricate a UBM structure and to deposit the solder bump. A few widely used methods of depositing bumps include evaporation, electroplating, electroless plating and screen-printing. Kung et al, U.S. Pat. No. 6,179,200 provides a description of these more widely used methods of depositing bumps as follows.

The formation of solder bumps can be carried out by an evaporation method of Pb and Sn through a mask for producing the desired solder bumps. When a metal mask is used, UBM metals and solder materials can be evaporated through designated openings in the metal mask and be deposited as an array of pads onto the chip surface.

In the evaporation method, a wafer is first passivated with an insulating layer, via holes are then etched through the wafer passivation layer which is normally $SiO_2$ to provide a communication path between the chip and the outside circuit. After a molybdenum mask is aligned on the wafer, a direct current sputtering cleans the via openings formed in the passivation layer and removes undesirable oxides. A cleaned via opening assures low contact resistance and good adhesion to the $SiO_2$. A chromium layer is evaporated through a metal mask to form an array of round metal pads each covering an individual via to provide adhesion to the passivation layer and to form a solder reaction barrier to the aluminum pad underneath. A second layer of chromium/copper is then co-evaporated to provide resistance to multiple reflows. This is followed by a final UBM layer of pure copper which forms the solderable metallurgy. A thin layer of gold may optionally be evaporated to provide an oxidation protection layer. These metal-layered pads define the solder wettable regions on the chips, which are commonly referred to as the ball limiting metallurgy (BLM) or under bump metallurgy (UBM). After the completion of UBM, solder evaporation occurs through a metal mask, which has a hole diameter slightly greater than the UBM mask-hole diameter. This provides the necessary volume for forming a subsequent solder ball. A solder reflow process is performed at a temperature of about 350 degrees Celsius to melt and homogenize the evaporated metal pad and to impart a truncated spherical shape to the solder bump. The evaporation method, even though well established and has been practiced for a long time in the industry, is a slow process and thus can not be run at a high throughput rate.

A second method for forming solder bumps is the electroplating method. In an electroplating process, UBM layers are first deposited, followed by the deposition of a photoresist layer, the patterning of the photoresist layer, and then the electro-deposition of a solder material into the photoresist openings. After the electro-deposition process is completed, the photoresist layer can be removed and the UBM layers can be etched by using the plated solder bumps as a mask. The solder bumps are then reflowed in a furnace reflow process. The photolithography/electroplating technique is a simpler technique than evaporation and is less expensive because only a single masking operation is required. However, electroplating requires the deposition of a thick and uniform solder over a whole wafer area and etching metal layers on the wafer without damaging the plated solder layer. The technique of electroless plating may also be used to form UBM structure.

Another solder bump formation technique that is capable of solder-bumping a variety of substrates is a solder paste screening method. The screen printing technique can be used to cover the entire area of an 8-inch wafer. In this method, a wafer surface covered by a passivation layer with bond pads exposed is first provided. UBM layers are then deposited on top of the bond pads and the passivation layer. After the coating of a photoresist layer and the patterning of the layer, the UBM layers are etched followed by stripping off the photoresist layer. A stencil is then aligned on the wafer and solder paste is squeegeed through the stencil to fill the openings on top of the bond pads and the UBM layers. After the stencil is removed, the solder bumps may be reflowed in a furnace to form solder balls.

One drawback of the solder paste screen printing process is that, with the recent trend in the miniaturization of device dimensions and the reduction in bump to bump spacing (or pitch), the prior art solder paste screening techniques become impractical. For instance, one of the problems in applying solder paste screening technique to modern IC devices is the paste composition itself. A paste in generally composed of a flux and solder alloy particles. The consistency and uniformity of the solder paste composition becomes more difficult to control with a decreasing solder bump volume. A possible solution for this problem is the utilization of solder paste that contains extremely small and uniform solder particles. However, this can only be achieved at a very high cost penalty. Another problem is using the solder paste screening technique in modern high-density devices is the reduced pitch between bumps. Since there is a large reduction in volume from a paste to the resulting solder bump, the screen holes must be significantly larger in diameter than the final bumps. It is therefore generally desirable to form solder bumps that are reflown into solder balls with a larger height and a larger pitch between the balls.

Several other methods are known to those skilled in the art for producing solder bumps on a semiconductor device. One such method is called the solder jet printing method. The solder jet printer method is based upon piezoelectric demand mode ink jet printing technology and is capable of producing and placing molten solder droplets 25–125 micrometers in diameter at rates of up to 2000 per second. In demand mode ink jet printing systems, a volumetric change in the fluid is induced either by the displacement of piezoelectric material that is coupled to the fluid or by the formation of the vapor bubble in the ink caused by heating a resistive element. The volumetric change causes pressure transience to occur in the fluid, and these are directed so as to produce a drop that issues from an orifice. A droplet is created only when it is desired in demand mode systems. Demand mode ink jet printing produces droplets that are approximately equal to the orifice diameter of the droplet generator.

Another method for producing solder bumps is known as the micro-punching method. In the micro-punching method, solder tape is supplied from a spool and rolled up by a motor driven spool. A micro-punch is driven by an electric actuator and a displacement enlarging mechanism. A micro-punch and die set blanks a thin solder tape and forms a small cylindrical piece. A solder flux may be formed over the entire semiconductor wafer to be bumped and the solder pieces may be punched and placed directly onto the wafer.

FIGS. 1A–G illustrate the various steps of a prior art method of forming a bump on a wafer or flip chip. FIG. 1A shows a semiconductor wafer 10 having a passivation layer 12 as on upper surface thereof. An opening 14 is formed in the passivation layer 12 down to a contact pad 16 of the semiconductor wafer 10. The semiconductor wafer upper surface is sputter cleaned to remove any oxide that may be present on the upper surface of the contact pad 16. As shown in FIG. 1B, thereafter an under bump metallurgy (UBM) 18 is deposited over the entire wafer by any of a variety of methods but preferably by sputtering. The UBM 18 may be made from any of a variety of metals, for example, layers of copper and titanium. Thereafter, a photoresist layer 20 is deposited over the wafer, developed and patterned to provide an opening 22 overlying the contact pad 16 (FIG. 1C). As shown in FIG. 1D, solder 24 is electroplated into the opening 22 and onto the UBM 18 overlying the contact pad 16. Thereafter, layers of copper and nickel 26 are electroplated over the solder 24. The photoresist layer 20 is removed by dry etching or other means (FIG. 1E). The excess UBM 18 is also removed by, for example, etching leaving a portion of the UBM overlying the contact pad 16 (FIG. 1F). Finally, the electrically conductive materials are reflown to form a solder ball or bump 28 on a semiconductor wafer 10.

In practicing the flip-chip bonding technology, it has also been found that the fatigue life of the solder ball joint is directly proportional to the height of the solder bumps (or solder balls after reflow). It is therefore desirable to increase the height of the solder balls during the fabrication process of the solder bumps and during the reflow process for the solder balls. Such increase in the height of the solder balls directly increases the fatigue life of a solder ball joint established between a flip-chip and a substrate. The present invention is directed to a method of improving the bump height.

SUMMARY OF THE INVENTION

One embodiment of the invention includes a method of making electrically conductive bumps of improved height on a semiconductor device. The method includes a step of depositing an under bump metallurgy over a semiconductor device having a contact pad thereon and a passivation layer as an upper surface of the semiconductor device and an opening formed therein down to the contact pad so that the under bump metallurgy extends into the opening of the passivation and onto the contact pad. A photoresist layer is deposited, developed and patterned over the semiconductor wafer to provide an opening over the under bump metallurgy and aligned with the contact pad. A first electrically conductive material is deposited into the opening in the photoresist layer. A second electrically conductive material is deposited over the first electrically conductive material and over a portion of the photoresist layer. Thereafter, the photoresist layer is removed, and the excess under bump metallurgy is removed leaving a portion of the under bump metallurgy overlying the contact pad and underneath the first electrically conductive material. A flux agent is applied to the top surface of the second electrically conductive material. The semiconductor device is hard baked to remove any oxide on the second electrically conductive material. Then a portion of the semiconductor devices is dipped in an electroless plating solution. The semiconductor device is removed from the electroless plating solution to provide a third electrically conductive material deposited on the second electrically conductive material. Finally, the electrically conductive materials are reflown to form a bump of improved height on the semiconductor device.

Another embodiment of the invention further includes a step of sputter cleaning the semiconductor device prior to the step of depositing the under bump metallurgy over the semiconductor device.

In another embodiment of the invention the first electrically conductive material comprises solder.

In another embodiment of the invention the second electrically conductive material comprises copper.

In another embodiment of the invention the second electrically conductive material comprises nickel.

In another embodiment of the invention the third electrically conductive material includes at least one of copper, nickel, silver and gold.

In another embodiment of the invention the step of depositing a first electrically conductive material comprises electroplating the first electrically conductive material into the opening in the photoresist layer.

In another embodiment of the invention the first electrically conductive material comprises solder electroplated into the opening in the photoresist.

In another embodiment of the invention the step of depositing a second electrically conductive material comprises electroplating the second electrically conductive material onto the first electrically conductive material.

In another embodiment of the invention the second electrically conductive material includes at least one of copper and nickel electroplated into the opening in the photoresist.

Another embodiment of the invention includes a method of making electrically conductive bumps of improved height on a semiconductor device. The method includes a step of depositing an under bump metallurgy over a semiconductor device having a contact pad thereon and a passivation layer as an upper surface of the semiconductor device with an opening therein down to the contact pad and so that the under bump metallurgy extends into the opening and onto the contact pad. The photoresist layer is deposited, developed and patterned over the semiconductor device to provide an opening over the under bump metallurgy and aligned with the contact pad. A first electrically conductive material is deposited into the opening in the photoresist layer. A second electrically conductive material is deposited over the first electrically conductive material and over a portion of the photoresist layer. A flux agent is applied to the top surface of the second electrically conductive material. The semiconductor device is hard baked to remove any oxide on the second electrically conductive material. After the hard baking step, the photoresist layer is removed. The excess under bump metallurgy is removed to leave a portion of the under bump metallurgy on the contact pad and underneath the first electrically conductive material. A portion of the semiconductor device is dipped in an electroless plating solution. The semiconductor device is removed from the electroless plating solution to provide a third electrically conductive material deposited on the second electrically conductive material. Finally, the electrically conductive materials are reflown to form a bump of improved height on the semiconductor device.

Another embodiment of the invention further includes a step of sputter cleaning the semiconductor device prior to the step of depositing an under bump metallurgy over the semiconductor device.

In another embodiment of the invention the first electrically conductive material comprises solder.

In another embodiment of the invention the second electrically conductive material comprises copper.

In another embodiment of the invention the second electrically conductive material comprises nickel.

In another embodiment of the invention the third electrically conductive material includes at least one of copper, nickel, silver and gold.

In another embodiment of the invention the step of depositing a first electrically conductive material comprises electroplating a first electrically conductive material into the opening in the photoresist layer.

In another embodiment of the invention the first electrically conductive material comprises solder electroplated into the opening in the photoresist.

In another embodiment of the invention the step of depositing a second electrically conductive material comprises electroplating the second electrically conductive material onto the first electrically conductive material.

In another embodiment of the invention the second electrically conductive material includes at least one of copper and nickel electroplated into the opening in the photoresist.

These and other objects, features and advantages in the present invention will become apparent from the following brief description of the drawings, detailed description of the preferred embodiments, and appended claims and drawings.

BRIEF DESCRIPTION OF THE DRAWINGS

FIG. 2G illustrates the step of applying a flux agent over the second electrically conductive material according to the present invention;

FIG. 2H illustrates the step of hard baking the semiconductor device according to the present invention;

FIG. 2I illustrates the step of dipping a portion of the semiconductor wafer in an electroless plating solution according to the present invention;

FIG. 2J illustrates the step of removing the semiconductor wafer from the electroless plating solution to form a third electrically conductive material on top of the second electrically conductive material according to the present invention;

DETAILED DESCRIPTION OF PREFERRED EMBODIMENTS

Figure 1A:
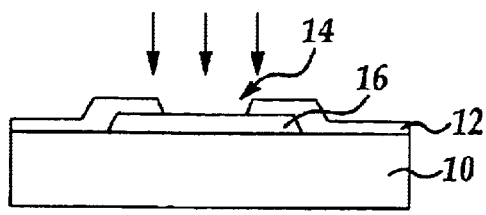
FIG. 1A illustrates the prior art step of sputter cleaning a semiconductor wafer.
Figure 1B:
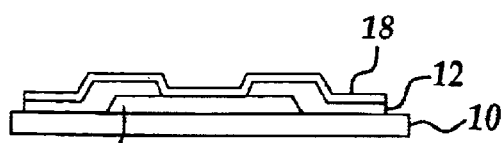
FIG. 1B illustrates the prior art step of depositing an under bump metallurgy over a semiconductor wafer.
Figure 1C:
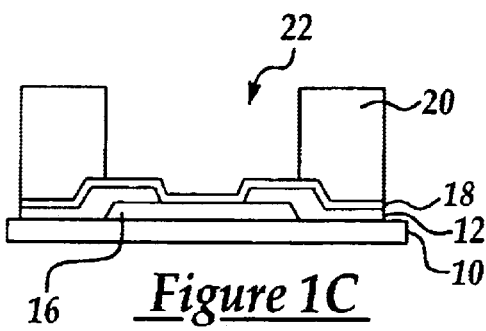
FIG. 1C illustrates the prior art steps of depositing, developing and patterning a photoresist layer to provide an opening over the contact pad on a semiconductor wafer.
Figure 1D:
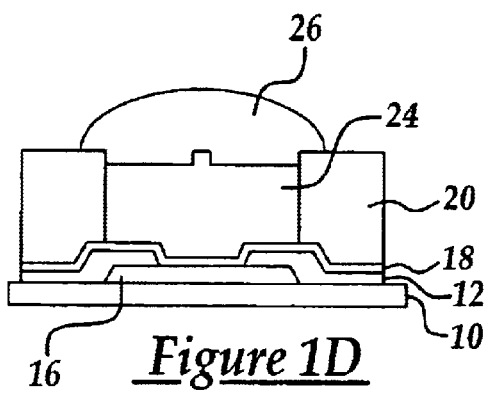
FIG. 1D illustrates the prior art step of electroplating solder, and nickel and copper over the contact pad on a semiconductor wafer.
Figure 1E:
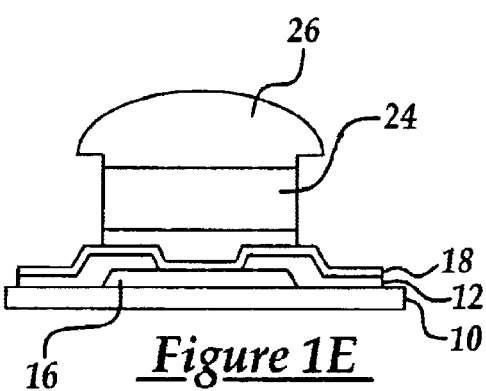
FIG. 1E illustrates a prior art step of removing the photoresist.
Figure 1F:
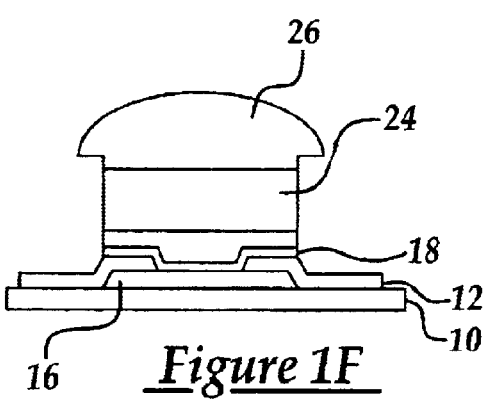
FIG. 1F illustrates a prior art step of removing the excess under bump metallurgy.
Figure 1G:
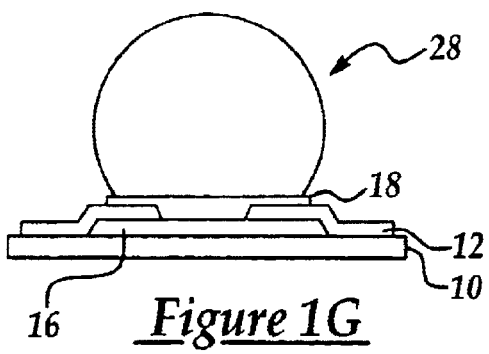
FIG. 1G illustrates the prior art step of reflowing the solder, copper, and nickel to form a bump on the semiconductor wafer.
Figure 2A:
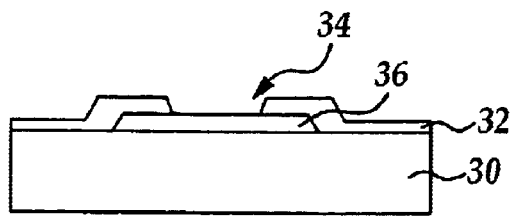
FIG. 2A illustrates the step of a sputter cleaning a semiconductor wafer according to the present invention.
Figure 2B:
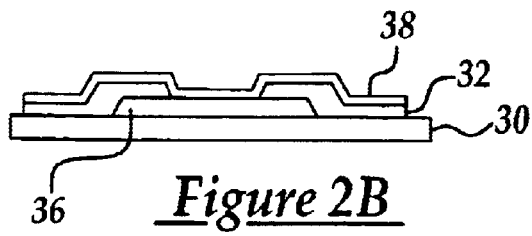
FIG. 2B illustrates the step of depositing an under bump metallurgy over a contact pad on a semiconductor wafer according to the present invention.
Figure 2C:
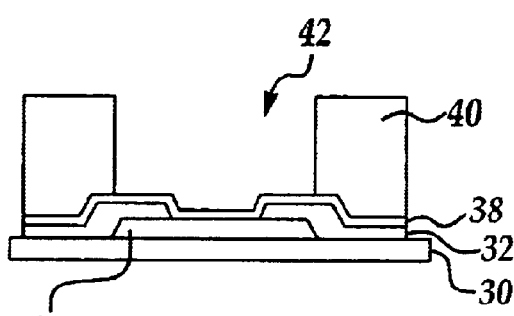
FIG. 2C illustrates the steps of depositing a photoresist layer, developing and patterning the photoresist to form an opening down to the contact pad on the semiconductor wafer according to the present invention.
Figure 2D:
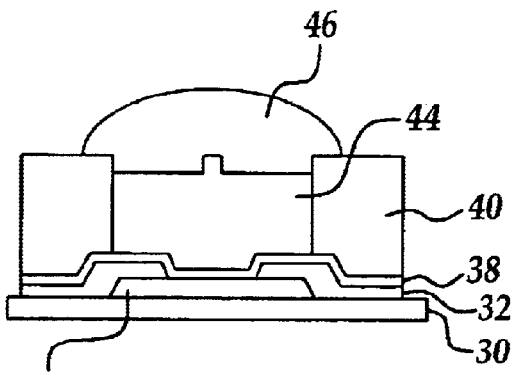
FIG. 2D illustrates the steps of electroplating a first electrically conductive material into the opening in the photoresist, and electroplating a second electrically conductive material on top of the first electrically conductive material according to the present invention.
Figure 2E:
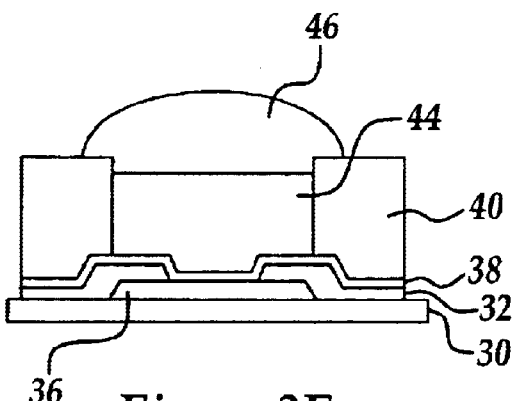
FIG. 2E illustrates the step of removing the photoresist according to the present invention.
Figure 2F:
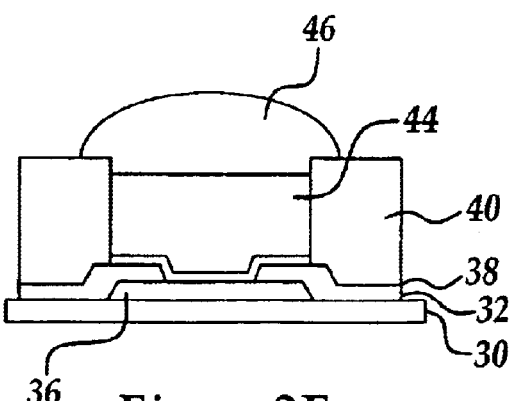
FIG. 2F illustrates a step of removing excess under bump metallurgy according to the present invention.
Figure 2K:
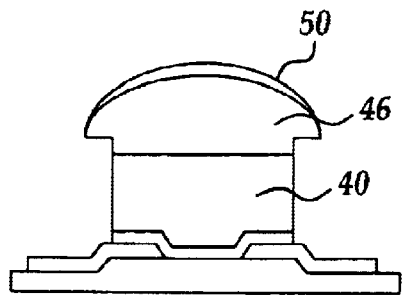
FIG. 2K illustrates a step of reflowing the electrically conductive materials to form a bump of improved height on the semiconductor wafer according to the present invention.
Figure 2K:
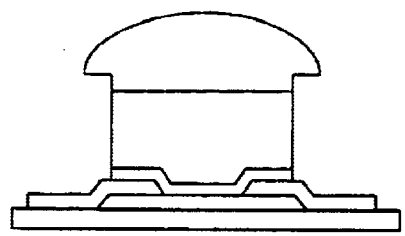
Figure 2K:
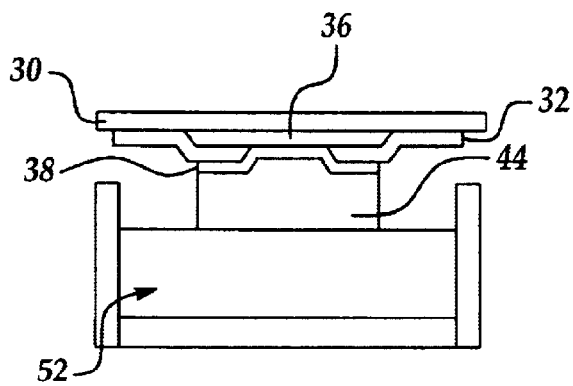
Figure 2K:
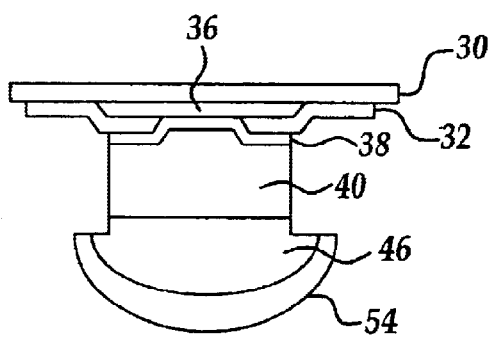
Figure 2K:
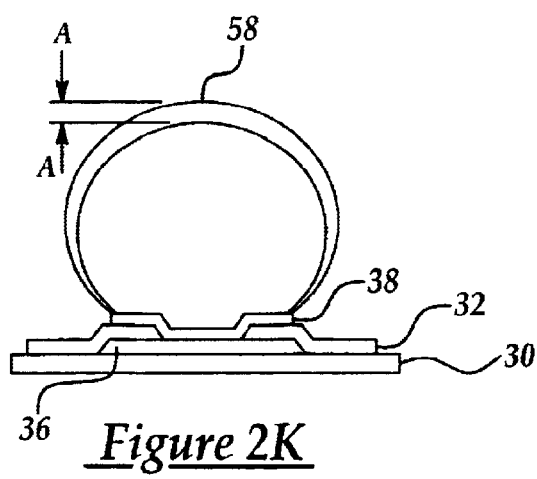

FIGS. 2A–K illustrate one embodiment of a method of making tall flip chip bumps according to the present invention. As shown in FIG. 2A, a semiconductor device 30 is provided having a passivation layer 32 as an upper surface thereof. An opening 34 is provided in the passivation layer 32 down to a bond or contact pad 36 of the semiconductor device 10. Any oxide that may be present on the upper surface of the contact pad 36 is removed by sputter cleaning. FIG. 2B illustrates the step of depositing an under bump metallurgy (UBM) 38 over the semiconductor wafer 30 and onto the contact pad 36. A photoresist layer 40 is deposited, developed and patterned to provide an opening 42 in the photoresist layer down to the UBM 38 overlying the contact pad 36 (FIG. 2C). As shown in FIG. 2D, a first electrically conductive material 44 is deposited into the opening 42 in the photoresist 40 and onto the UBM 38 overlying the contact pad 36. Ideally the first electrically conductive material 44 is deposited into the opening 42 in the photoresist layer 40 by electroplating. Preferably the first electrically conductive material includes solder, such as a 63 weight percent tin and 37 weight percent lead eutectic solder composition. A second electrically conductive material 46 is electroplated over the first electrically conductive material 44. Preferably the second electrically conductive material includes copper and nickel. The photoresist layer 40 is removed by ashing or etching (FIG. 2E). Thereafter, the excess UBM 38 is removed by etching or other suitable means (FIG. 2F). A flux agent 50 is then applied to the second electrically conductive material 46. The flux agent 50 may be applied by any of a variety of suitable means including brushing or spraying the flux agent 50 onto the second electrically conductive material 46 (FIG. 2G). Examples of suitable flux agents may include, but are not limited to, compositions including boron oxide and phosphorus pentoxide. Thereafter, the semiconductor wafer with the first electrically conductive material 40, second electrically conductive material 46, and flux agent 50 is hard baked to remove any oxide that may be on the surface of the second electrically conductive material 46 (FIG. 2H). The hard bake temperature typically is from about 120–140° C. Thereafter a portion of the semiconductor wafer 30 is dipped in an electroless plating solution 52 (FIG. 2I). Preferably, only the second electrically conductive material 46 is submerged in the electroless plating solution 52. The electroless plating solution 52 may include any of a variety of metals including copper, nickel, silver, and gold and mixtures thereof. The semiconductor wafer 30 is removed from the electroless plating solution 52 to provide a third electrically conductive material 54 deposited on the second electrically conductive material 46. Thereafter, the electrically conductive materials, 44, 46, 54 are reflown by heating the semiconductor wafer to form a bump 58 on the semiconductor wafer 30. The newly formed bump 58 has an improved height which is illustrated lines A—A in FIG. 2K. The method of the present invention improves the height of the bump by approximately 3–10 micrometers or approximately 10 percent over a standard solder bump that has been electroplated with copper and nickel.

Figure 3A:
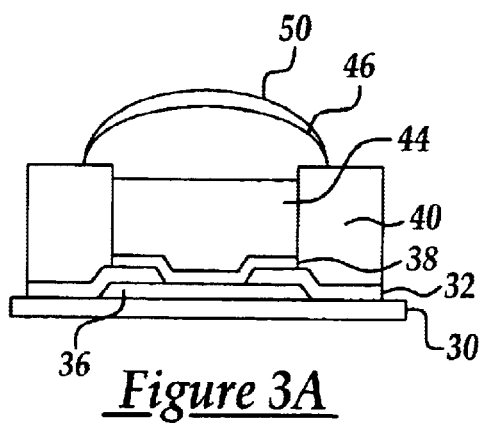
FIG. 3A illustrates an alternative embodiment of the invention wherein a flux agent is applied to the second electrically conductive material prior to removing the photoresist layer according to the present invention.
Figure 3B:
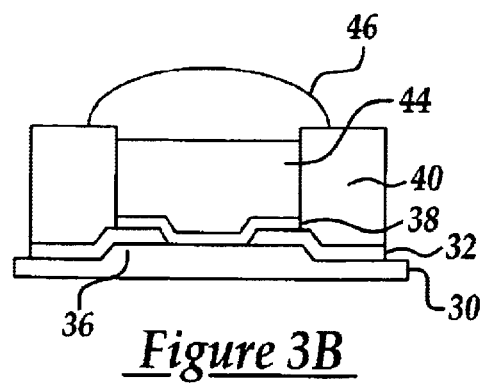
FIG. 3B illustrates the step of hard baking the semiconductor wafer according to the present invention.
Figure 3C:
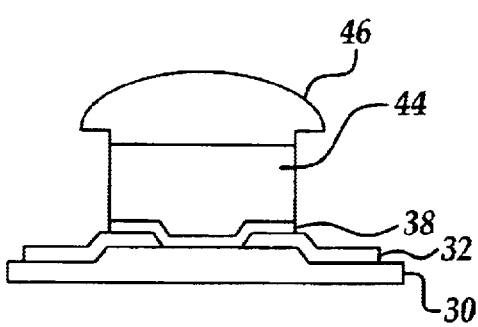
FIG. 3C illustrates a step of removing the photoresist layer and excess under bump metallurgy according to the present invention.
Figure 3D:
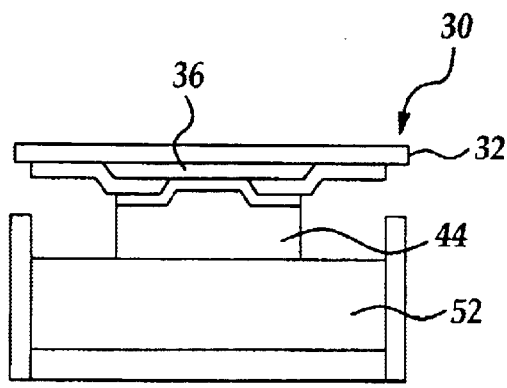
FIG. 3D illustrates the step of dipping a portion of the semiconductor wafer in an electroless plating solution according to the present invention.
Figure 3E:
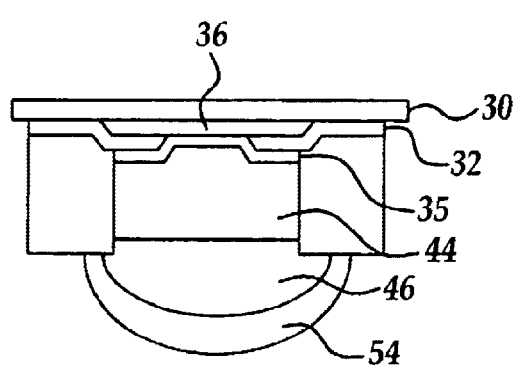
FIG. 3E illustrates the step of removing the semiconductor wafer from the electroless plating solution to provide a third electrically conductive material deposited on the second electrically conductive material according to the present invention.
Figure 3F:
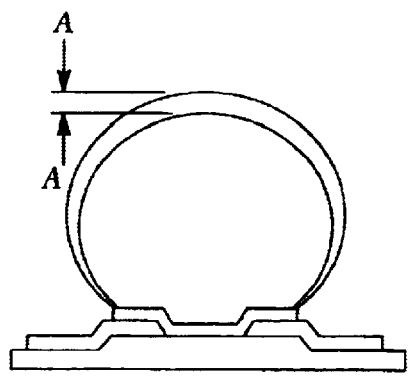
FIG. 3F illustrates a step of reflowing the electrically conductive materials to form a bump of improved height on the semiconductor wafer according to the present invention.

FIGS. 3A–F illustrates an alternative embodiment of a method of forming tall flip chip bumps according to the present invention. The alternative method utilizes the same steps as shown in FIGS. 2A–D to provide a semiconductor wafer having a photoresist layer 40 deposited thereon with an opening therein down to the UBM 38 overlying a contact pad 36 of the semiconductor wafer 30. A first electrically conductive material 44 is deposited into the opening in the photoresist 40 and a second electrically conductive material 46 is electroplated over the first electrically conductive material 44 to provide the device shown in and described above with respect to FIG. 2D. Thereafter, a flux agent 50 is deposited over the second electrically conductive material 46 as shown in FIG. 3A. Again, the semiconductor device 30 is hard baked to remove any oxide that may be on the surface of the second electrically conductive material 46 (FIG. 3B). The hard bake temperature ranges from about 120–140° C. Because the photoresist layer 40 is still present over the semiconductor wafer 38, the hard baking step makes the subsequent removal of the photoresist layer more difficult. However, leaving the photoresist on during the bard bake results in a more uniform height of the bumps on the wafer. Alternatively, with the photoresist layer 40 stilt on the semiconductor wafer 30, the semiconductor wafer may be soft baked at a temperature ranging from about 90–100° C. to remove any oxide on a second electrically conductive material 46. The photoresist layer 40 is removed by etching as shown in FIG. 3C and any excess UBM 38 is also removed by etching. A portion of the semiconductor wafer 30 is dipped in an electroplating solution 52 in the same manner as indicated in the other embodiment of the invention (FIG. 3G). The semiconductor wafer 30 Is removed from the electroless plating solution 52 to provide a third electrically conductive material 54 deposited on a second electrically conductive material 46. The electrically conductive materials 44, 46 and 54 are heated to reflow the same and form a bump 58 of improved height on the semiconductor wafer 30. Again, an increase in bump height of about 3–10 micrometers or 10 percent is accomplished according to the present invention as indicated by arrows A—A in FIG. 3F.

What is claimed is:

1. A method of making electrically conductive bumps of improved height on a semiconductor device comprising:

depositing an under bump metallurgy over a semiconductor device having a contact pad thereon and a passivation layer as an upper surface of the semiconductor device and an opening formed in the passivation layer down to the contact pad so that the under bump metallurgy extends into the opening and onto the contact pad;

depositing, developing and patterning a photoresist layer over the semiconductor device to provide an opening over the under bump metallurgy and aligned with the contact pad;

depositing a first electrically conductive material into the opening in the photoresist layer;

depositing a second electrically conductive material over the first electrically conductive material and over a portion of the photoresist layer;

removing the photoresist layer, removing excess under bump metallurgy to leave a portion of the under bump metallurgy overlying the contact pad and underneath the first electrically conductive material;

applying a flux agent to the top surface of the second electrically conductive material;

heating the semiconductor device to remove any oxide on the second electrically conductive material;

dipping a portion of the semiconductor device in an electroless plating solution;

removing the semiconductor device from the electroless plating solution to provide a third electrically conductive material deposited on the second electrically conductive material; and reflowing the electrically conductive materials to provide a bump of improved height on the semiconductor device.

2. A method as set forth in claim 1 further comprising the step of sputter cleaning the semiconductor device prior to the step of depositing an under bump metallurgy over the semiconductor device.

3. A method as set forth in claim 1 wherein the first electrically conductive material comprises solder.

4. A method as set forth in claim 1 wherein the second electrically conductive material comprises copper.

5. A method as set forth in claim 1 wherein the second electrically conductive material comprises nickel.

6. A method as set forth in claim 1 wherein the third electrically conductive material comprises at least one of copper, nickel, silver and gold.

7. A method as set forth in claim 1 wherein the step of depositing a first electrically conductive material comprises electroplating the first electrically conductive material into the opening in the photoresist layer.

8. A method as set forth in claim 7 wherein the first electrically conductive material comprises solder.

9. A method as set forth in claim 1 wherein the step of depositing a second electrically conductive material comprises electroplating the second electrically conductive material onto the first electrically conductive material.

10. A method as set forth in claim 9 wherein the second electrically conductive material comprises at least one of copper and nickel.

11. A method of making electrically conductive bumps of improved height on a semiconductor device comprising:

depositing an under bump metallurgy over a semiconductor device having a contact pad thereon and a passivation layer as an upper surface of the semiconductor device and an opening formed in the passivation layer down to the contact pad so that the under bump metallurgy extends into the opening and onto the contact pad;

depositing, developing and patterning a photoresist layer over the semiconductor device to provide an opening over the under bump metallurgy and aligned with the contact pad;

depositing a first electrically conductive material into the opening in the photoresist layer;

depositing a second electrically conductive material over the first electrically conductive material and over a portion of the photoresist layer;

applying a flux agent to the top surface of the second electrically conductive material;

hard baking the semiconductor device comprising heating the semiconductor device to remove any oxide on the second electrically conductive material;

removing the photoresist layer after the bard baking;

removing excess under bump metallurgy to leave a portion of the under bump metallurgy overlying the contact pad and underneath the first electrically conductive material;

dipping a portion of the semiconductor device in an electroless plating solution;

removing the semiconductor device from the electroless plating solution to provide a third electrically conductive material deposited on the second electrically conductive material; and reflowing the electrically conductive materials to provide a bump of improved height on the semiconductor device.

12. A method as set forth in claim 11 further comprising the step of sputter cleaning the semiconductor device prior to the step of depositing an under bump metallurgy over the semiconductor device.

13. A method as set forth in claim 11 wherein the tint electrically conductive material comprises solder.

14. A method as set forth in claim 11 wherein the second electrically conductive material comprises copper.

15. A method as act forth in claim 11 wherein the second electrically conductive material comprises nickel.

16. A method as set forth in claim 11 wherein the third electrically conductive material comprises at least one of copper, nickel, silver and gold.

17. A method as set forth in claim 11 wherein the step of depositing a first electrically conductive material comprises electroplating the first electrically conductive material into the opening in the photoresist layer.

18. A method am set forth in claim 17 wherein the first electrically conductive material comprises solder.

19. A method as set forth in claim 11 wherein the step of depositing a second electrically conductive material comprises electroplating the second electrically conductive material onto the first electrically conductive material.

20. A method as set forth in claim 19 wherein the second electrically conductive material comprises at least one of copper and nickel.

* * * * *